United States Patent [19]
Sato et al.

[11] Patent Number: 5,704,800
[45] Date of Patent: Jan. 6, 1998

[54] ELECTRICAL CONNECTOR FOR CONNECTION TO LSI PACKAGE HAVING PRELOADED AND CANTILEVERED PLATE TYPE CONTACT WITH L-SHAPE SLITS FOR PROVIDING TWO CONTACT POINTS

[75] Inventors: Kazuomi Sato; Yoshiaki Ichimura, both of Tokyo, Japan

[73] Assignee: Japan Aviation Electronics Industry, Limited, Tokyo, Japan

[21] Appl. No.: 655,625

[22] Filed: May 30, 1996

[30] Foreign Application Priority Data

May 31, 1995 [JP] Japan .................................. 7-133608

[51] Int. Cl.$^6$ ................................................ H01R 13/629
[52] U.S. Cl. .................................................... 439/342
[58] Field of Search ........................ 439/342, 259–270, 439/682, 842, 861

[56] References Cited

U.S. PATENT DOCUMENTS

| | | |
|---|---|---|
| 5,342,214 | 8/1994 | Hsu ......................................... 439/342 |
| 5,443,591 | 8/1995 | Tsai ......................................... 439/342 |
| 5,492,488 | 2/1996 | Hsu ......................................... 439/342 |
| 5,562,474 | 10/1996 | Lee ......................................... 439/342 |

Primary Examiner—Hien Vu
Attorney, Agent, or Firm—Laff, Whitesel, Conte & Saret, Ltd.

[57] ABSTRACT

In an electrical connector wherein a cover insulator with mount of an LSI package is moved in a predetermined direction relative to a base insulator supporting a contact element in a contact hole so as to move a package pin in the contact hole toward a contact portion of the contact element to thereby bring the package pin into contact with the contact portion, the contact portion is a plate with an L-shape slit and having two finger portions to provide a two-point contact with the package pin and is elastically deflected by an inner projection on an inner wall to be preloaded to thereby reduce a force for bringing the package pin into contact with the contact portion but without reduction of contact pressure.

6 Claims, 6 Drawing Sheets

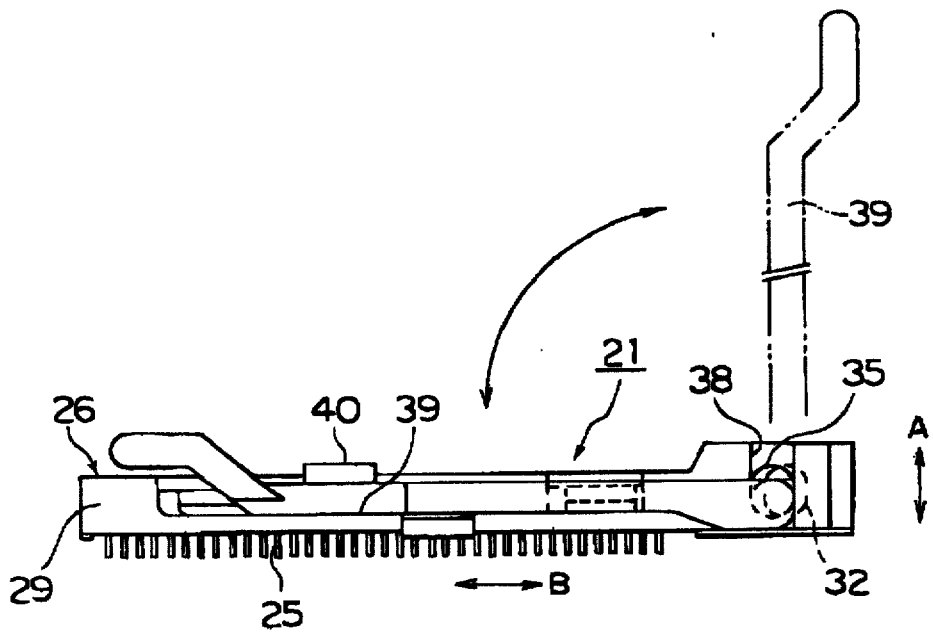
FIG. 1 PRIOR ART
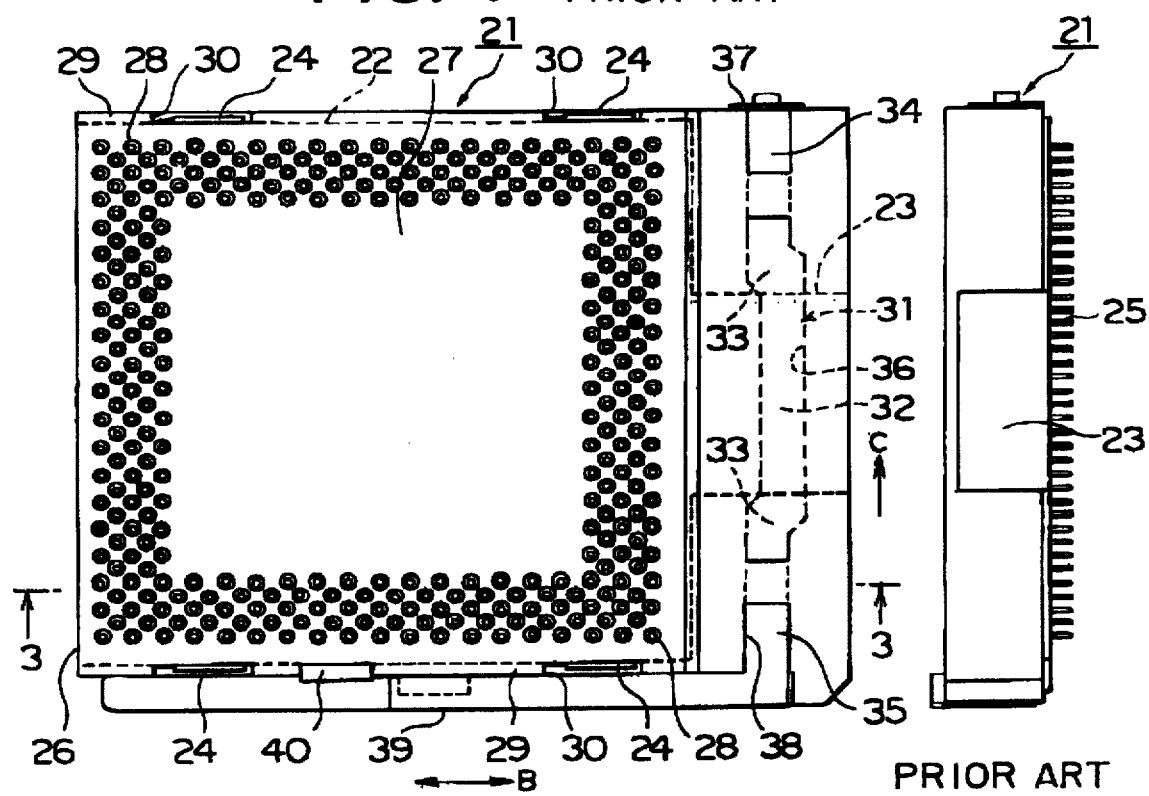
FIG. 2 PRIOR ART
FIG. 2A PRIOR ART

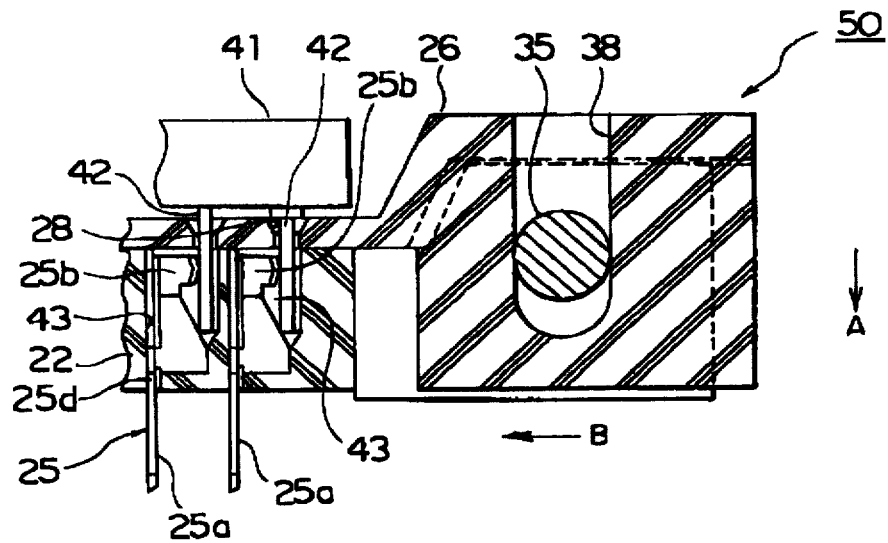
FIG. 3 PRIOR ART
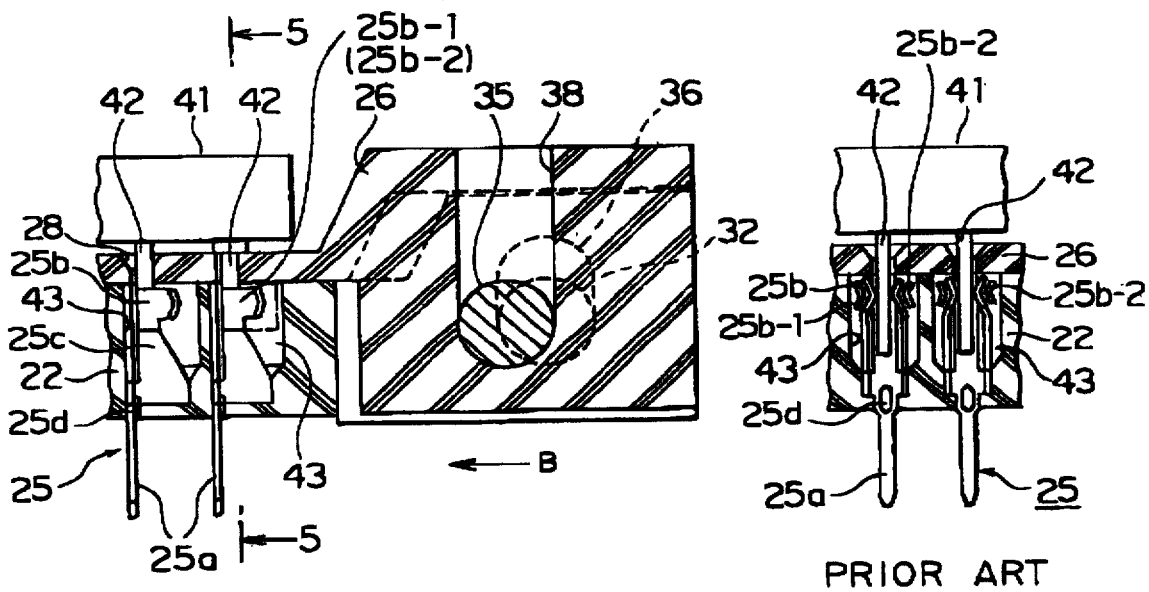
FIG. 4 PRIOR ART
FIG. 5 PRIOR ART ELECTRICAL CONNECTOR FOR
CONNECTION TO LSI PACKAGE HAVING
PRELOADED AND CANTILEVERED PLATE
TYPE CONTACT WITH L-SHAPE SLITS FOR
PROVIDING TWO CONTACT POINTS

BACKGROUND OF THE INVENTION

This invention relates to an electrical connector for an LSI package which is particularly of a zero insertion force (ZIF) type, namely, a zero Insertion force socket connector.

In the manner which will later be described more in detail, an electrical connector is used for connection of an LSI package with an electrical circuit board. Such an electrical connector is mounted on and electrically connected to the electrical circuit board and serves as an LSI package holder on the electrical circuit board.

As is known in the art, the LSI package comprises a package board and a plurality of package pins protruded from the package board. A known electrical connector for the LSI package comprises a base insulator to be mounted on the electrical board and having a plurality of contact receiving holes formed therein in a first direction, and a plurality of contact elements of a socket type received in the contact receiving holes for connection with the package pins. Each of the contact receiving holes is an elongated hole which has a hole shape extended in a second direction perpendicular to the first direction. Each of the contact elements comprises a terminal portion to downwardly project from the base insulator in the first direction for connection to a conductor pattern on the electrical circuit board, a contact portion for making a contact with one of the package pins, and an intermediate portion connecting and bridging between the terminal portion and the contact portion. A lower part of the intermediate portion adjacent the terminal portion is fixed to the base insulator within the contact receiving hole so that the contact element is fixedly supported by the base insulator with the contact portion being cantilevered by the fixed portion. The contact portion is disposed at a first position near a side wall at an end of the elongated hole in the second direction and is provided with a pair of wings which extend in parallel with each other with a gap left therebetween to form a socket contact portion. The gap is smaller than a diameter of each of the package pins. The other, or a second, end portion of the elongated hole is for loosely receiving a corresponding one of the package pins. A cover insulator is movably mounted on the base insulator to cover the base insulator and is for supporting the LSI package. The cover insulator has a plurality of through openings for the package pins. The cover insulator is reciprocatingly movable on the base insulator between a waiting position and a connection position in the second direction. When the cover insulator is in the waiting position, the through openings are just above the second end portions of the elongated holes, respectively. The LSI package is mounted so that the package pins are received in the through openings, the package pins are also loosely inserted in the second end portions of elongated holes of the base insulator.

On moving the base insulator relative to the cover insulator in the second direction towards the connecting position, the package pins are slid into the gaps of pair of wings of the socket contact portions in the contact receiving holes to be brought into contact with the socket contact portions, respectively.

In the known electrical contact for connection to the LSI package, the contact elements have the socket contact portions having the pair of wings. Thus, the socket contact portions have such wide surfaces for the wings so that it is necessary to carry out metal plating thereon. Owing to such a wing structure, too much materials for the wings also are needed. Besides, the connector must have appreciable thickness for support of the wing structure. As a result, the connector costs so much in production and is undesirably bulky. Further-more, it is difficult to increase the number of the socket contacts so that it is impossible to arrange a large number of socket contacts with a high density. Moreover, a user needs a considerably driving force for moving the cover plate with the LSI package in the second direction to press into gaps of paired wings of the socket contact portions so as to connect the package pins with the socket contact portions.

SUMMARY OF THE INVENTION

It is consequently an object of this invention to provide an electrical connector for an LSI package wherein the connector is compact and a user's driving power for connection is reduced.

It is another object of the invention to provide an electrical connector for an LSI package without application of substantial insertion force to the package.

It is a further object of the invention to provide an electrical connector for an LSI package wherein the connector is capable to arrange the large number of contact elements with a high density.

Other objects of this invention will become clear as the description proceeds.

According to this invention, there is provided an electrical connector for connection of an LSI package with a plurality of package pins protruding in a predetermined direction therefrom. The connector comprises a plurality of contact elements to be brought into contact with the package pins, respectively, a base insulator having a plurality of contact receiving holes fixedly receiving the contact elements to generally extend in a first direction, respectively, each of the contact receiving holes having an extended hole portion adjacent the contact element in a second direction perpendicular to the first direction for loosely receiving a corresponding one of the package pins, a cover insulator mounted on the base insulator to be movable in the second direction for receiving the LSI package thereon and having a plurality of through openings for loosely receiving the package pins passing therethrough, whereby the package pins are moved within the contact receiving holes in the second direction to be brought into contact with contact elements when the cover insulator with mount of the LSI package is moved in the second direction relative to the base insulator. Each of the contact elements comprises: a terminal pin portion protruding from the base insulator in the first direction: a contact plate portion having two elastically supported finger portions defined by an L-Shape slit cut from a side thereof, the two finger portions providing two-point contact with the package pin: and an intermediate plate portion bridging between the terminal pan portion and the contact plate portion, the intermediate portion being fixedly supported to the base insulator within the contact receiving hole to thereby cantilever the contact plate portion in the contact receiving hole. The contact receiving hole has a projecting wall portion inwardly projecting from an inner wall of the hole and engaging with the contact plate portion to elastically deflect the contact portion into a preloaded condition.

The electrical connector can further comprise a crank axle for moving the base insulator relative to the cover insulator in the second direction.

BRIEF DESCRIPTION OF THE DRAWING

FIG. 1 is a side view of a known electrical connector for connection of LSI package;

FIG. 2 is a top view of the connector of FIG. 1;

FIG. 2A is a side view of the connector of FIG. 2;

FIG. 3 is a sectional view of a portion of the connector taken along line 3—3 in FIG. 2. with mount of an LSI package and with a lever being pulled up to set the cover insulator in a waiting condition;

FIG. 4 is a similar sectional view of FIG. 3, with the lever being pushed down to set the cover insulator in a connecting condition;

FIG. 5 is a fragmentary sectional view of the connector taken along line 5—5 in FIG. 4 when the cam lever is pushed down into the base insulator;

DESCRIPTION OF THE PREFERRED EMBODIMENTS

Figure 6:
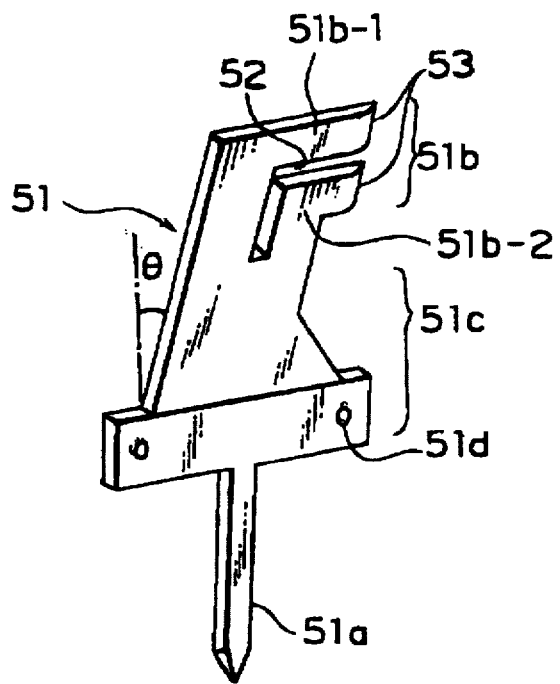
FIG. 6 is a perspective view of a contact element used in a connector according to a preferred embodiment of this invention.

Referring to FIGS. 1 through 5, a known electrical connector for connection of an LSI package with an electrical circuit board will first be described in order to facilitate an understanding of this invention.

Referring to FIGS. 1, 2 and 2A, the known connector 21 comprises a base insulator 22, as shown by a dotted line in FIG. 2, of a rectangular plate with an ear portion 23 protruding from a first one of four side surfaces of the rectangular plate. Projections 24 are formed to project from opposite second and third side surfaces adjacent the first side surface. A plurality of contact elements 25 are accommodated and arranged in the base insulator 22 and have terminal portions downwardly protruding from the base insulator 22 in a first direction as shown by arrow A in FIG. 1. The terminal portions are only shown in FIGS. 1 and 2.

A cover insulator 26 is movably mounted on the base insulator 22 and comprises a top plate 27 having a plurality of package pin receiving holes 28 formed and arranged therein, and first and second side plates 29 and 29 covering the second and the third side surfaces of the base insulator 22. The first and second side plates 29 and 29 are formed with guide grooves 30 receiving and engaging the projections so that the cover insulator 26 is movable in a second direction (arrow B in FIG. 1) perpendicular to the first direction (A) by relative movement of the projections 24 along the guide grooves A cam axle or a crank axle 31 connects the base insulator 22 with the cover insulator 26 for moving the cover insulator 26 relative to the base insulator 22 in the second direction. The crank axle 31 comprises a crank pin 32, a pair of crank arms 33 connected to the opposite ends of the crank pin 32, and a pair of crank shafts 34 and 35 connected to the crank arms 33, respectively. The ear portion 23 of the base insulator 22 is formed with a hole 36 extending therein in a third direction (arrow C in FIG. 2) perpendicular to both of the first direction (A) and the second direction (B). In the hole 36, the crank pin 32 is disposed to be rotatable and movable therein in the first direction. The crank shaft 34 is rotatably movably engaged With the first one of side plates 29 of the cover insulator 26 by an engaging O ring 37. The other crank shaft 35 is also fitted into and engaged with a groove 38 formed in the cover insulator 26 adjacent the ear portion 23 of the base insulator 22. Therefore, the crank shaft 35 is rotatable in the groove 38 and movable in the first direction (A) in the groove 38. A lever or handle 39 is connected to the end of the crank shaft 35 so that the crank axle 31 can be rotated by rotation or turning operation of the handle 39. The rotation of the crank shaft 31 causes movement of the cover insulator 26 in the second direction (B).

When the handle 39 is positioned as shown by an imaginary line in FIG. 1, that is, stands on the cover insulator 26 in the first direction (A), the cover insulator 26 is in a first or a waiting position where the LSI package (not shown) can be mounted on the cover insulator 26 but is not yet brought into contact with the contact elements 25.

When the handle 39 is turned from the waiting position to a position as shown by a solid line in FIGS. 1 and 2, the cover insulator 26 is moved in the second direction (B) and eventually to a second or a connection position where LSI package is brought into contact with the contact elements 25. In the position, the handle 39 extends in the second direction (B) and is locked by engagement with a locking projection 40 projecting from the cover insulator in the third direction (C).

Now, referring to FIGS. 3–5, description will be made as regards the relative structure of the base insulator 22, contact elements 25, and package pin receiving holes 28 of the cover insulator, and as regards contacting operation between the contact elements 25 and the package pins.

The LSI package as shown at 41 has a plurality of package pins 42 projecting from a bottom surface of the LSI package 41.

The base insulator 22 is provided with a plurality of contact receiving holes 43 formed therein in the first direction, and the contact elements 25 of a socket type received in the contact receiving holes 43 for connection with the package pins 42. Each of the contact receiving holes 43 is an elongated hole which has a hole shape extended in the second direction (B) perpendicular to the first direction (A). Each of the contact elements 25 comprises a terminal portion 25a downwardly projecting from the base insulator 22 in the first direction (A) for connection to a conductor pattern on the electrical circuit board (not shown), a contact portion 25b for making a contact with one of the package pins 42, and an intermediate portion 25c connecting and bridging between the terminal portion 25a and the contact portion 25b. A lower part 25d of the intermediate portion 25c adjacent the terminal portion 25a is fixed to the base insulator 22 within the contact receiving hole 43 so that the contact element 25 is fixedly supported by the base insulator 22 with the contact portion 25b being cantilevered by the fixed portion 25d. The contact portion 25b is disposed at a first position near a side wall at the end of the elongated hole 43 in the second direction (B) and is provided with a pair of wings 25b-1, 25b-2 which extend in parallel with each other with a gap left therebetween to form a socket contact portion. The gap is smaller than a diameter of each of the package pins 42. The other, or a second, end portion of the elongated hole 43 is for loosely receiving a corresponding one of the package pins 42 when the cover insulator 26 having mount of the LSI package 41 is positioned in the waiting condition. That is when the cover insulator 26 is In the waiting position, the through openings 28 are just above the second end portions of the elongated holes 43, respectively. The LSI package 41 is mounted on the cover insulator 26 so that the package pins 42 are received in the through openings 28, and the package pins 42 are also loosely inserted in the second end portions of elongated holes 43 of the base insulator 22, as shown in FIG. 3.

Now, when the lever 39 is turned to the second direction (B), the crank axle 31 is rotated and causes the crank shaft 35 to push the cover insulator 26 in the second direction (B) by engagement of the crank shaft 35 and the hole 38 of the cover insulator 26. Thus, the cover insulator 26 is moved in relation to the base insulator 22 in the second direction (B) towards the connecting position, so that the package pins 42 slide into the gaps of pair of wings 25b-1 and 25b-2 of the socket contact portions 25b in the contact receiving holes 43 and are brought into contact with the socket contact portions 25b, respectively, as shown in FIGS. 4 and 5.

The known electrical contact for connection to the LSI package has problems as described in the preamble.

Now, referring now to FIGS. 6–9, the description will proceed to an electrical connector 50 shown therein according to a preferred embodiment of this invention. The connector 50 is similar to the known connector 21 shown in FIGS. 1–5 except structures of contact elements and contact element receiving holes. Therefore, similar parts are designated by the same reference-numerals as in FIGS. 1–5 and description thereto will be omitted for the purpose of simplification of the description.

Referring to FIG. 6, the feature of the connector 50 Is that each of contact elements 51 is made of a sheet of metal plate such as phosphor bronze and comprises a terminal pin portion 51a of a pin type, a contact plate portion 51b, and an intermediate plate portion 51c bridging the terminal pin portion 51a and the contact portion 51b. A fixed portion or lower part 51d of the intermediate plate portion. 51c adjacent the terminal portion 51a is a portion fixed to the base insulator. The fixed portion 51d has a considerably increased but a predetermined width in comparison with the terminal pin portion 51a, and the intermediate plate portion 51c has a gradually decreased width towards the contact plate portion 51b which has a width greater than that of the terminal pin portion 51a. The intermediate portion 51c is bent at an upper position adjacent the fixed portion 51d by an angle of θ which is about 10 angular degree. The contact plate portion 51b is slit from one side thereof into an inverted L-shape form shown at 52 which extends from a side of the contact plate portion 51b to the intermediate plate portion 51c and, therefore, comprises two finger portions 51b-1 and 51b-2 which project from the intermediate plate portion, and then extend in parallel in the second direction (B). The finger portions are elastically supported by the intermediate portion 51c. Each of the finger portions 51b-1 and 51b-2 has a tapered end 53 as shown in the figure.

Figures 7, 8:
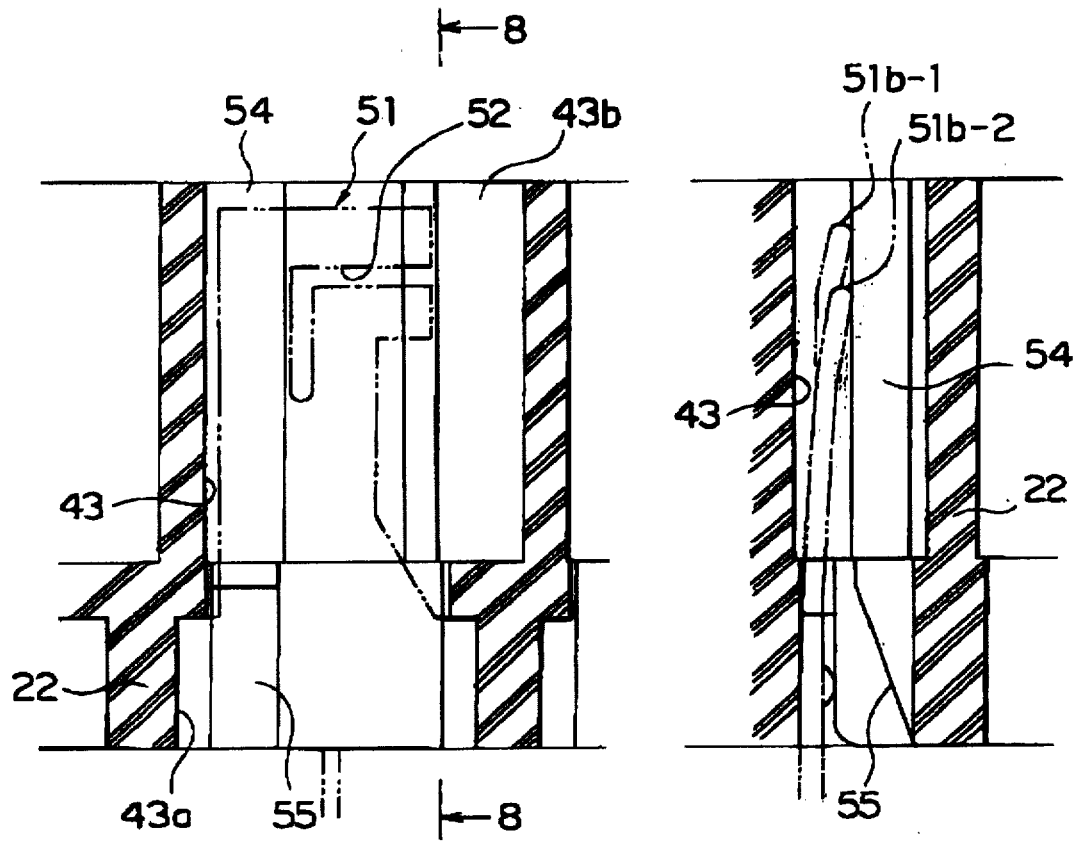
FIG. 7 is a partial longitudinal sectional view of a main portion of the connector according to the preferred embodiment.
FIG. 8 is another sectional view taken along line 8—8 in FIG. 7.
Figure 9:
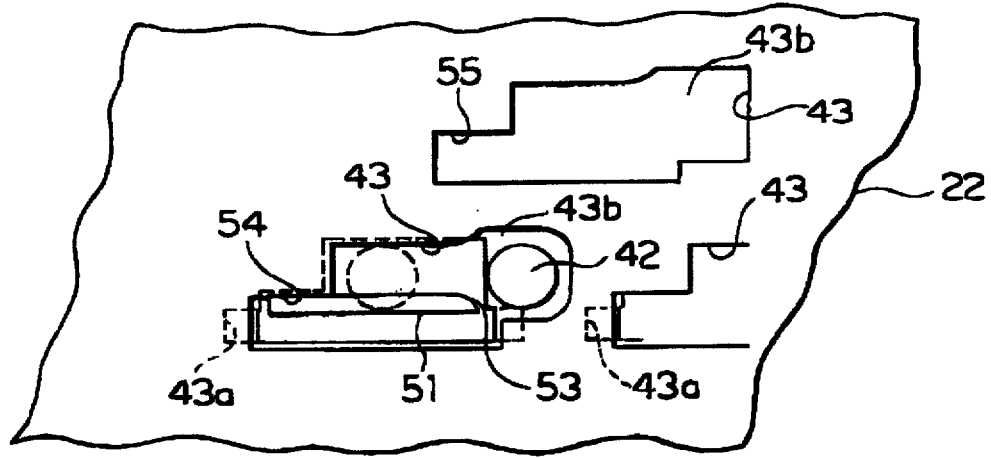
FIG. 9 is a partial top view of the main portion of the connector of FIGS. 6–7.

Referring to FIGS. 7–9, the base insulator 22 is provided with a plurality of contact receiving holes 43 which are elongated holes similar to those in the known connector shown in FIGS. 3–5. Each of the contact receiving holes 43 has a contact fixing hole portion 43a as the lower end portion of the holes 43 and is provided with a projecting wall 54 partially projecting inwardly on one side wall adjacent an end wall of the elongated hole, the projecting wall 54 extending downwardly and being tapered at 55 to be gradually lowered in the contact fixing hole portion 43a.

The contact element 51 is inserted into the contact receiving hole 43 by firstly leading the contact portion 51b into the contact fixing hole portion 43a. Then, the top end of the contact portion 51b at first engages with the tapered surface 55 and is elastically deflected. By further progress of the inserting operation, the top end slides on and along the projecting wall 54, and is then completely inserted into the hole 43 with the fixed portion 51d being press-fitted and fixed in the contact fixing hole portion 43a. Thus, the contact portion 51b is-cantilevered by the fixed portion 51d and is eventually maintained in a preloaded condition.

There is a gap left between the contact portion 51b and an inner wall of the hole 43 opposite to the contact portion 51b, and the gap is slightly smaller than the size of the package pin 42.

Figure 10:
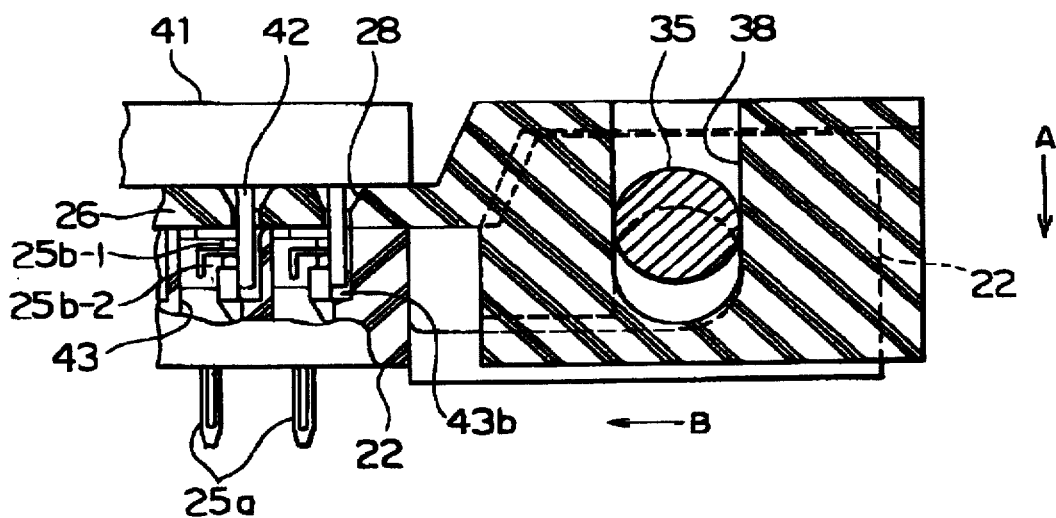
FIG. 10 is a sectional view of the connector of FIGS. 6–9 illustrating a condition with mount of the LSI package on a cover insulator and with the lever is pulled up, similar to FIG. 3.

The contact receiving hole 43 has a width larger than the contact portion 51b to form a space 43b for receiving the package pin 42 when the cover plate 26 is in the waiting condition as shown in FIGS. 9 and 10.

Figures 11, 12:
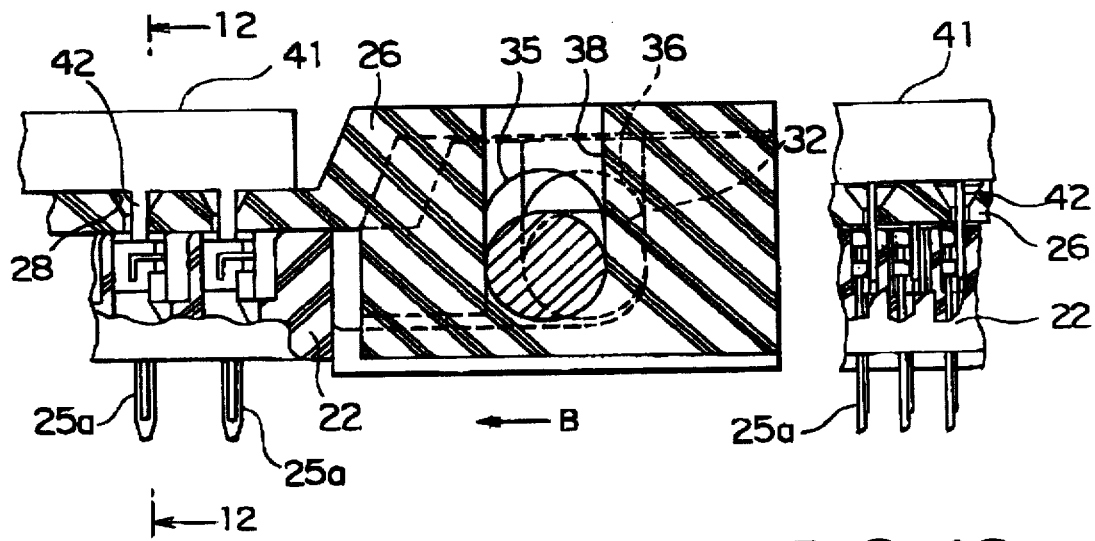
FIG. 11 is a sectional view similar to FIG. 10 but with the lever being pushed down, similar to FIG. 4.
FIG. 12 is a fragmentary partial sectional view taken along line 12—12 in FIG. 11.

In the manner as described in connection with FIGS. 1 and 2, when the lever 39 is turned to the second direction (B) to move the cover insulator 26 in the second direction (B) from the waiting position to the connecting position, the package pans 42 move in the second direction (B) to be brought into contact with the contact portion 51b, as shown in FIGS. 11 and 12. In detail, since the contact portion 51b is elastically deflected and preloaded by the projecting wall 54 and has the tapered surfaces 53, the package pin 42 is readily moved into the gap between the contact portion 51b and the opposite inner wall of the hole 43, with a reduced force for moving the cover insulator 26. When the package pin 42 is inserted into the gap between the contact portion 51b and the opposite inner wall, the package pin 42 further deflects the contact portion 51b and receives almost all of the elastic force of the contact portion 51b so that a high contact pressure is insured between the contact portion 51b and the package pin 42. Further, the contact portion 51b is formed with the L-shape slit 52 to form two finger portions 51b-1 and 51b-2 which provide two-point contact between the socket contacts 17 and the contact portion 51b as shown in FIG. 12.

Referring to FIGS. 13–16, an electrical connector according to another embodiment shown therein is similar to the connector of FIGS. 6–12 except that a contact element 61 is provided with a bent portion or shoulder portion 61e and that the contact receiving hole 43 are accordingly modified. Therefore, differences between connectors of the present and the previous embodiments are only described below, for the purpose of simplification of the description.

Figure 13:
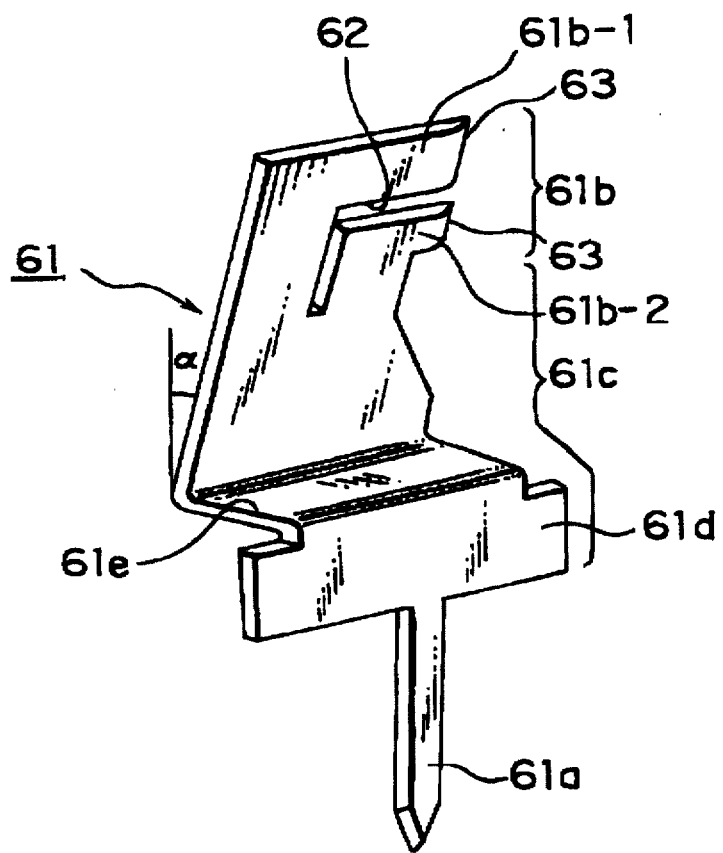
FIG. 13 is a perspective view of a contact element of a modification.

Referring to FIG. 13, the contact element 61 is also made of a sheet of metal plate such as phosphor bronze and comprises a terminal portion 61a of a pin type, a contact portion 61b, and an intermediate portion 61c bridging the terminal portion 61a and the contact portion 61b. The lower part 61d of the intermediate portion 61c adjacent the pin portion 61a is a portion fixed to the base insulator. The intermediate portion 61c further has the shoulder portion 61e adjacent the fixed portion 61a. The fixed portion 61a has a considerably increased but a predetermined width in comparison with the terminal portion 61a, and the shoulder portion 61e has a width slightly smaller than that of the fixed portion 61d. The remaining portion of the intermediate portion 61c has a gradually decreased width from the crank portion 61e towards the contact portion 61b which has a width greater than that of the terminal portion 61a. The shoulder portion 61e and the fixed portion 61d make an angle of about 90 degree therebetween. The shoulder portion 61e and the contact portion 61b or the remaining portion of the intermediate portion 61c make an angle of α which is about 10 angular degree. The contact portion 61b is slit from one side thereof into an inverted L-shape form shown at 62 and, therefore, comprises two finger portions 61b-1 and 61b-2 which are elastically supported by the intermediate portion 61c. Each of the finger portions 61b-1 and 61b-2 has a tapered end 63 as shown in the figure. The finger portions 61b-1 and 61b-2 provide two-point contact with the package pin in the similar manner as those in FIGS. 6–12. As shown in FIG. 13, the finger portions 61b-1 and 61b-2 project in parallel in the second direction (B) from the intermediate portion 61c.

Figures 14, 15:
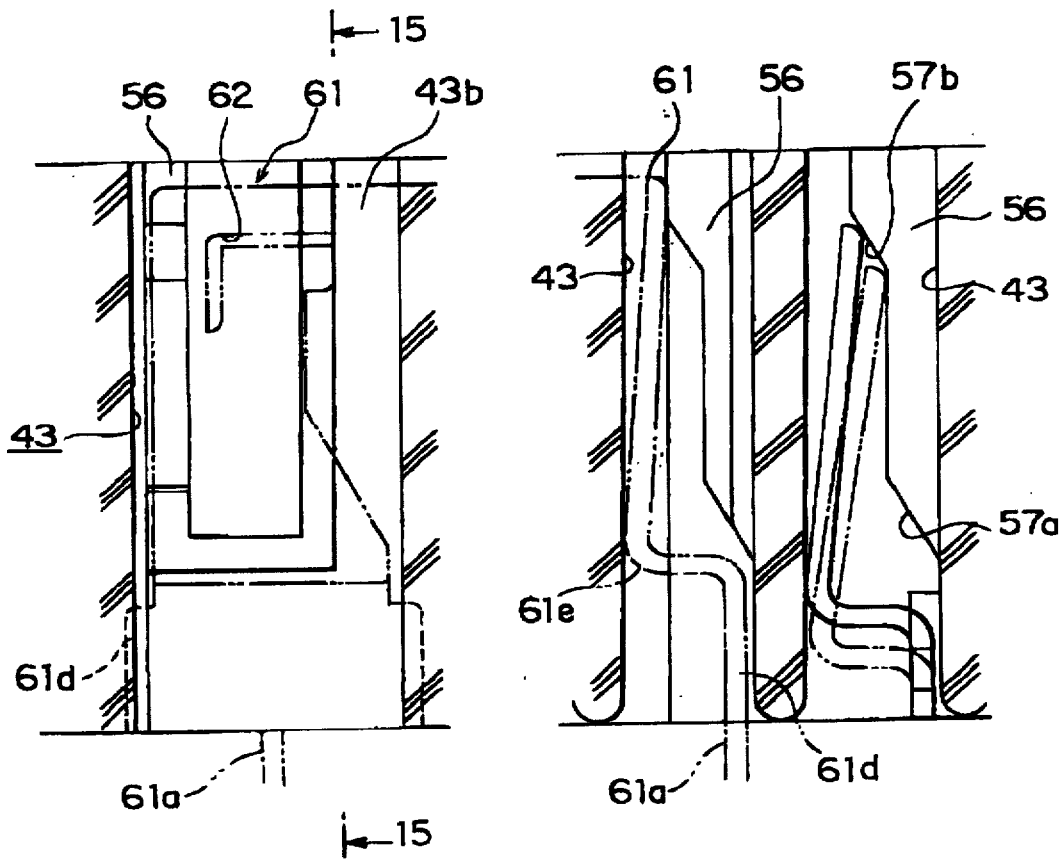
FIGS. 14–16 shows a connector using the contact element of FIG. 13 illustrating views similar to FIGS. 7–9, respectively.
Figure 16:
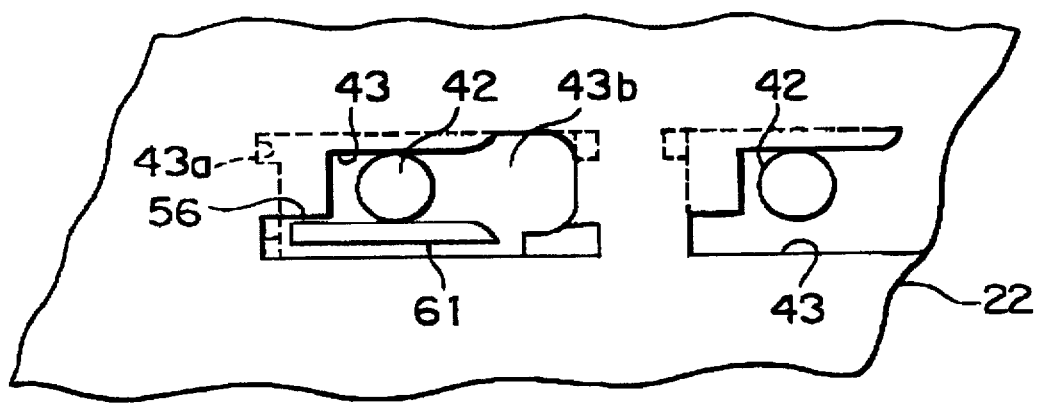

Referring to FIGS. 14–16, each of contact receiving holes 43 formed in the base insulator 22 similar to those in FIGS. 6–12 but the contact fixing hole portion 43a is formed at a position different from that in FIGS. 6–12 because of the crank portion 61e of the contact element 61. That is, the contact fixing hole portion 43a in FIG. 16 is formed at an opposite side of the hole 43 in comparison with that in FIG. 9. The remaining hole structure can be made similar to that in the embodiment of FIGS. 6–12.

In the shown embodiment, although a projecting wall 56 corresponding to the projecting wall 54 in FIGS. 7–9 is formed on the inner wall of the contact receiving hole 43, it is slightly different from the projecting wall 54 in FIGS. 7–9 in that the projecting wall 56 is formed into two step forms with two tapered portions 57a and 57b. In insertion of the contact element 61 into the contact receiving hole 43, the contact portion 61c is gradually deflected through the tapered portions 57a and 57b and is eventually preloaded in the completely assembled condition in the contact receiving hole 43, in the similar manner as in the connector 50 shown in FIGS. 7–12.

The connector of this embodiment is similar to the previous embodiment of FIGS. 6–12 in operation for bringing the LSI package pin 42 into contact with the contact element 61 in the connector.

What is claimed is:

1. An electrical connector for connecting an LSI package with a plurality of package pins protruding in a predetermined direction therefrom, said connector comprising: a plurality of contact elements to be brought into contact with said package pins, respectively; a base insulator having a plurality of contact receiving holes for fixedly receiving said contact elements to generally extend in a first direction, respectively; each of said contact receiving holes having an extended hole portion adjacent said contact element in a second direction perpendicular to the first direction for loosely receiving a corresponding one of said package pins; a cover insulator mounted on said base insulator, said cover being movable in the second direction for receiving said LSI package thereon and having a plurality of through openings for loosely receiving said package pins passing therethrough, whereby said package pins are moved in said second direction within said contact receiving holes in order to be brought into contact with said contact elements when said cover insulator is moved to mount said LSI package, said cover being moved in the second direction relative to said base insulator, each of said contact elements comprising a terminal pin portion, a contact plate portion, and an intermediate portion bridging an area between said terminal pin portion and said contact plate portion;

wherein:
said terminal pin portion protrudes from said base insulator in the first direction;
said intermediate portion is fixedly supported to said base insulator within said contact receiving hole in order to cantilever said contact plate portion in said contact receiving hole;
said contact plate portion having two elastically supported finger portions defined by an L-shape slit cut and extending from a side of the contact plate portion to the intermediate plate portion, said two finger portions projecting from said intermediate plate portion and then extending in parallel in the second direction, said two finger portions providing a two-point contact with said package pin; and
said contact receiving hole having a wall portion projecting inwardly and partially projecting from an inner wall of said hole and partially engaging said contact plate portion to elastically deflect said contact plate portion into a preloaded condition in order to form a gap between said contact plate portion and said inner wall into which said package pin is inserted to be electrically connected to said contact plate portion.

2. An electrical connector as claimed in claim 1, which further comprises a crank axle coupled with said base insulator and said cover insulator for moving said base insulator relative to said cover insulator in said second direction, said crank axle having a crank pin, a pair of crank arms connected to the opposite ends of the crank pins, and a pair of crankshafts connected to the crank arms, respectively.

3. An electrical connector as claimed in claim 1, wherein each of said contact elements is bent at a part of said intermediate portion to provide an increased contact pressure with said package pins.

4. An electrical connector as claimed in claim 1, wherein each of said contact elements is bent to form a shoulder portion in said intermediate portion, so that said shoulder portion is appreciably dimensioned with approximately a right angle from said terminal pin portion.

5. An electrical connector as claimed in claim 1, wherein said projecting wall portion is provided with a tapered surface in said first direction so that said contact plate portion is elastically deformed when said contact element is inserted into said contact receiving hole.

6. An electrical connector as claimed in claims 1, wherein said projecting wall portion has a multi-step shape forming at least two tapered portions, the contact plate portion gradually being deflected through the tapered portions and each of the finger portions being preloaded when said contact element is inserted into said contact receiving hole.

* * * * *